US010275001B2

(12) United States Patent
Kam et al.

(10) Patent No.: US 10,275,001 B2
(45) Date of Patent: Apr. 30, 2019

(54) THERMAL THROTTLING OF ELECTRONIC DEVICES

(71) Applicant: Intel Corporation, Santa Clara, CA (US)

(72) Inventors: Timothy Y. Kam, Portland, OR (US); Sandeep Ahuja, University Place, WA (US); Rajat Agarwal, Beaverton, OR (US); Avinash Sodani, Portland, OR (US); Jinho Suh, Portland, OR (US); Meenakshisundaram Chinthamani, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 76 days.

(21) Appl. No.: 14/752,512

(22) Filed: Jun. 26, 2015

(65) Prior Publication Data

US 2016/0378149 A1    Dec. 29, 2016

(51) Int. Cl.
*G06F 1/20* (2006.01)
*G06F 1/32* (2006.01)
*G06F 1/3206* (2019.01)
*G06F 1/3234* (2019.01)
(Continued)

(52) U.S. Cl.
CPC .............. *G06F 1/206* (2013.01); *G06F 1/324* (2013.01); *G06F 1/3206* (2013.01); *G06F 1/3225* (2013.01); *G06F 1/3234* (2013.01); *G06F 1/3275* (2013.01); *G06F 2212/1028* (2013.01);
(Continued)

(58) Field of Classification Search
CPC .... G06F 1/3206; G06F 1/3225; G06F 1/3234; G06F 1/324; G06F 1/3275
See application file for complete search history.

(56) References Cited

U.S. PATENT DOCUMENTS

2007/0255972 A1* 11/2007 Gaskins ................. G06F 1/206
                                                           713/500
2008/0007192 A1    1/2008 Williams et al.
(Continued)

FOREIGN PATENT DOCUMENTS

EP         2833238 A1    2/2015

OTHER PUBLICATIONS

PCT International Search Report, PCT Application No. PCT/US2016/028849, dated Aug. 2, 2016, 3 pages.
(Continued)

*Primary Examiner* — Jaweed A Abbaszadeh
*Assistant Examiner* — Gayathri Sampath
(74) *Attorney, Agent, or Firm* — International IP Law Group, P.L.L.C.

(57) ABSTRACT

Disclosed herein is a computing device configured to implement thermal throttling of a component of the computing device. The computing device includes an electronic component and a temperature sensor thermally coupled to the electronic component. The computing device also includes a thermal management controller to receive a temperature measurement from the temperature sensor and generate a throttling factor for the electronic component. If the temperature measurement is greater than a specified threshold, the throttling factor is to reduce performance of the electronic component to be at least the performance guarantee for the electronic component.

16 Claims, 6 Drawing Sheets

(51) Int. Cl.
*G06F 1/324* (2019.01)
*G06F 1/3225* (2019.01)

(52) U.S. Cl.
CPC ............ *Y02D 10/126* (2018.01); *Y02D 10/13* (2018.01); *Y02D 10/14* (2018.01); *Y02D 10/16* (2018.01)

(56) References Cited

U.S. PATENT DOCUMENTS

| | | | |
|---|---|---|---|
| 2008/0103634 A1* | 5/2008 | Santos | G05D 23/19 700/299 |
| 2009/0052266 A1* | 2/2009 | Askar | G06F 13/161 365/212 |
| 2009/0091996 A1 | 4/2009 | Chen et al. | |
| 2010/0100254 A1* | 4/2010 | Artman | H05K 7/20836 700/299 |
| 2014/0028377 A1 | 1/2014 | Rosik et al. | |
| 2014/0101371 A1 | 4/2014 | Nguyen et al. | |
| 2014/0365793 A1* | 12/2014 | Cox | G06F 1/206 713/320 |
| 2015/0134988 A1* | 5/2015 | Wang | G06F 1/206 713/322 |
| 2016/0062421 A1* | 3/2016 | Sugawara | G06F 1/206 700/299 |

OTHER PUBLICATIONS

Extended European Search Report for Related EP Application 16814855 with a completion date of Dec. 21, 2018 and dated Jan. 7, 2019., 3 pages.

* cited by examiner

THERMAL THROTTLING OF ELECTRONIC DEVICES

TECHNICAL FIELD

The present disclosure relates to thermal protection for memory devices. More specifically, the present disclosure describes techniques for throttling the performance of a memory device based on detected junction temperature.

BACKGROUND ART

High performance computing devices tend to generate significant amounts of heat during operation. Excessive heat can damage some electronics or may result in error. Therefore, various techniques exist for dissipating the heat through the use of heat sinks, heat pipes, fans, and the like. However, as computing devices become more compact, these heat dissipation measures tend to be less effective. In some cases, processors such as central processing units (CPUs) are throttled to avoid excessive temperatures. In a typical throttling arrangement, the clock frequency of the CPU can be reduced to reduce the amount of generated heat.

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

The present disclosure provides techniques for throttling an electronic device in a computing system. Throttling is a technique wherein the processing speed of an electronic device such as a Central Processing Unit (CPU) is reduced to maintain acceptable thermal characteristics. To ensure that the electronic device operates properly and is not damaged by excessive heat, the electronic device is configured to operate at temperatures under the electronic device's maximum junction temperature, $T_{j\_max}$. The maximum junction temperature for an electronic device is usually specified by the manufacturer. If the electronic device approaches or exceeds the maximum junction temperature, the electronic device can be throttled to reduce the amount of heat generated.

In the case of a memory device, throttling the memory device reduces the memory device's bandwidth. However, some users may have an expectation that under certain conditions, the memory bandwidth of the computing device will remain above some specified performance level. Therefore, user satisfaction may suffer if the memory bandwidth of the computing device drops below this expected performance level. The present disclosure provides a throttling technique that can be used to ensure that thermal characteristics of the electronic device remain at acceptable levels while still maintaining a performance level expected by the user. In the following description, the throttling of Dynamic Random Access Memory (DRAM) is provided as an example implementation. However, the techniques can be applied to throttling any other type of non-volatile memory and other types of silicon devices on the package whose temperature can be sensed and performance controlled if the devices temperature goes over certain temperature threshold.

Figure 1:
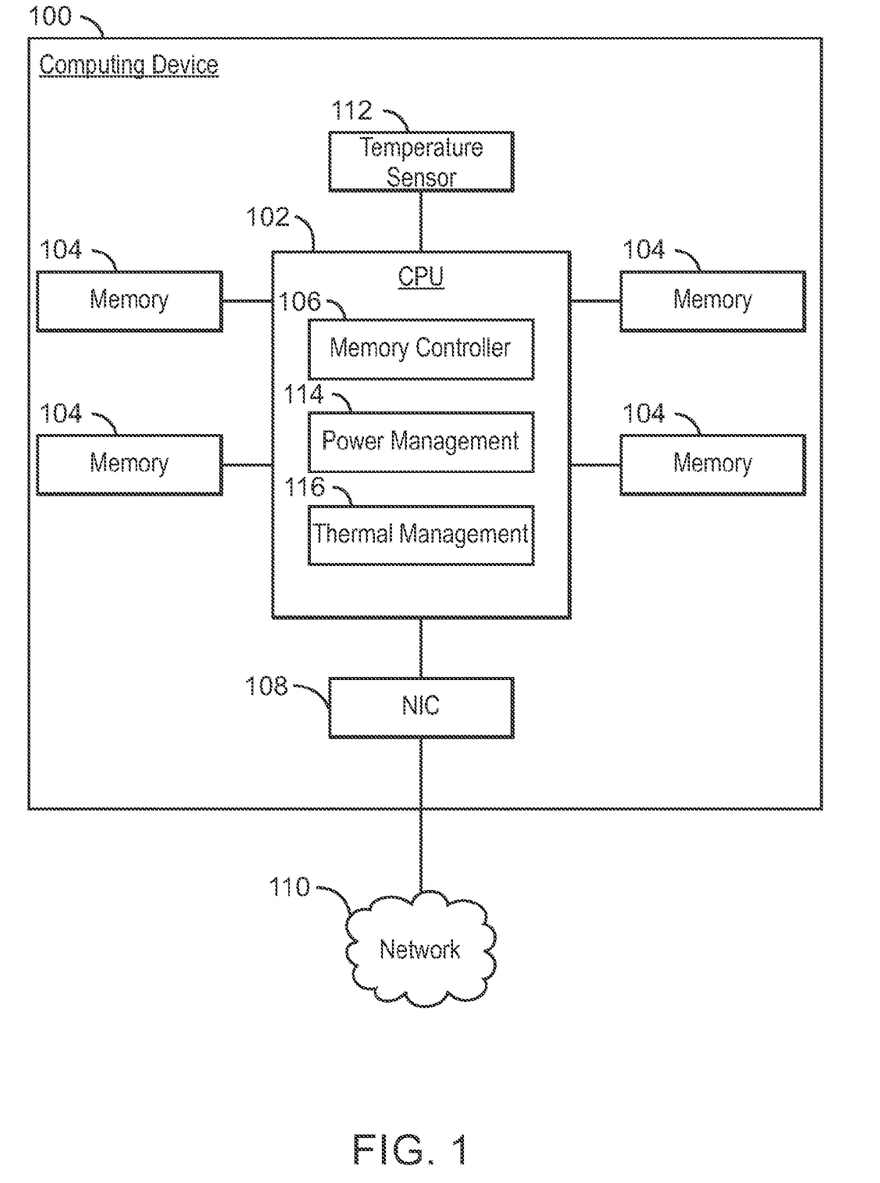
FIG. 1 is a block diagram of a computing device configured to implement the throttling techniques described herein.

FIG. 1 is a block diagram of a computing device configured to implement the throttling techniques described herein. The computing device 100 may be any type of computing device, such as a mobile phone, a smart phone, a laptop computer, a tablet computer, a server computer, a server blade, or a compute node of a clustered computing system, for example. The computing device 100 includes a Central Processing Unit (CPU) 102 that is adapted to execute stored instructions, as well as a memory device 104 that stores instructions that are executable by the CPU 102. The CPU 102 can be a single core processor, a multi-core processor, or any number of other configurations. The CPU 102 can also include an integrated memory controller 106 that enables the CPU 102 to access the memory devices 104. In other embodiments, the memory controller 106 can be a separate device that is external to the CPU 102.

The memory devices 104 can include random access memory (RAM), such as Dynamic Random Access Memory (DRAM), or any other suitable memory type. Some memory devices 104 may be a vertical stack of memory dies, such as a stacked Multiple Channel Dynamic Random Access Memory (MCDRAM). Each memory device 104 can use a multiple-channel memory architecture that uses multiple channels of data transfer between the memory devices 104 and the memory controller 106. Although four memory devices are shown, the computing device 100 can include any suitable number of memory devices 104.

The computing device 100 can also include a Network Interface Controller (NIC) 108 that enables the CPU 102 to communicate with other devices through a network 110. The network 110 can be any suitable type of network, a storage area network (SAN), a Local Area Network (LAN), the Internet, and others. In some examples, the network 110 is a switching fabric of a clustered computing system, wherein the computing device 100 is one of the compute nodes in the cluster.

The computing device 100 can also include one or more temperature sensors 112. The temperature sensors 112 can be configured to sense the temperatures of various elements of the computing device 100, including the CPU 102, the memory devices 104, the memory controller 106, and the NIC 108. The temperature sensors 112 may be disposed in proximity to the specific device that it is intended to sense. For example, the temperature sensor 112 may be integrated into a device, or the temperature sensors 112 may be disposed in or adjacent to a heat sink coupled to the sensed device. The temperature that is directly measured may be used to compute an estimated junction temperature of the corresponding device. References herein to "measuring junction temperature" or "junction temperature measurements" include techniques in which the temperature sensor is disposed near the semiconductor device and the junction temperature is computed from the temperature actually sensed by the temperature sensor.

In some examples, the CPU 102, memory devices 104, and NIC 108, are packaged together as a multi-chip module. The multi-chip module is an electronic package in which multiple integrated circuit dies are packaged onto a single substrate. The multi-chip module can include a common heat sink, which is thermally coupled to all of the electronic devices. The temperature sensors 112 can be disposed within the package. A temperature sensor 112 may be disposed in the heat sink adjacent to the CPU 102 to measure the CPU junction temperature. Another temperature sensor 112 may be disposed adjacent to one of the memory devices 104 to measure the junction temperature of the memory devices 104. In some examples, a single temperature sensor 112 can be used for all of the memory devices 104. In some examples, each memory device 104 is associated with its own temperature sensor 112, and junction temperatures measured are separately for each memory device 104. Various other configurations are possible.

As can be appreciated, the computing device 100 and other computing devices in a data center generally require electrical power in computing and executing tasks. A data center with a great number of High Performance Computing (HPC) units can consume a large amount of electrical power. To save power and reduce operating costs, a power budget can be imposed on one or more computing devices 100 of the data center. The computing device 100 can limit its power usage in accordance with the power budget by reducing the processing performance of some components, such as the CPU 102, memory devices 104, and network interface 110. The power budget may be configured by a system administrator or other user, and may change depending on various factors such as time of day, electricity rates, power source, and others.

In FIG. 1, implementation of power budgeting is performed by a power management unit 114. The power management unit 114 may be implemented as a logic hardware of the CPU 102, software running on the CPU 102, or other configurations. For example, the power management unit 114 can also be implemented in a separate processor. The power management unit 114 is configured to reduce the power consumption of the computing device 100 in accordance with a user-given power limit by reducing the processing speed of components of the computing device 100, a technique sometimes referred to as power throttling.

The CPU 102 also includes a thermal management unit 116. The thermal management unit 116 is configured to ensure that components of the computing device 100 do not overheat. The thermal management unit 116 may be implemented as a logic hardware of the CPU 102, software running on the CPU 102, or other configurations. For example, the thermal management unit 116 can also be implemented in a separate processor. The thermal management unit 116 can reduce the junction temperatures on a component by reducing the processing speed of the component. In the case of memory, the thermal management unit 116 can measure the junction temperature of one or more memory devices 104 and throttle the memory bandwidth, based on a comparison of the measured junction temperatures with a maximum allowed junction temperature. The higher the measured junction temperature is in relation to a maximum allowed junction temperature, the more throttling may be applied to the electronic device. The level of throttling is referred to herein as a throttling parameter. In some examples, the level of throttling is computed as a bandwidth percentage, which is multiplied by the maximum power consumable by the memory of the electronic device. The bandwidth percentage may be referred to herein as the throttling factor. Throttling may be performed separately for each memory device 104 with a different throttling parameter applied to each memory device 104. Throttling may also be performed for all of the memory devices 104 as a whole using a single throttling parameter. The CPU 102 can also be configured so that when throttling is activated for any device on the package, the CPU 102 can deny any request from the Operating System (OS) to boost performance by activating the turbo mode.

As mentioned above, in some cases, the user may have a specific expectation regarding the performance of the computing device 100. The performance of the computing device can refer to any quantifiable characteristic that describes the communications or processing speed of the computing device. For example, the performance of the computing device can refer to a clock speed of a processor, a number of memory accesses per unit of time, a number of computations per unit of time, a number of bits transmitted over a communication network per unit of time, and others. In some examples, the user is given a utilization constraint as a performance guarantee. The utilization constraint is an expression of minimum performance parameters to be met by the computing device 100. For example, with regard to memory, the computing device 100 may be under a bandwidth utilization constraint of 60 percent of the full bandwidth capacity of the memory. In some systems, the memory bandwidth may be recorded over time and reported to the user. If the memory bandwidth falls below the performance guarantee as a result of thermal throttling, even momentarily, the user may become dissatisfied.

Figure 2:
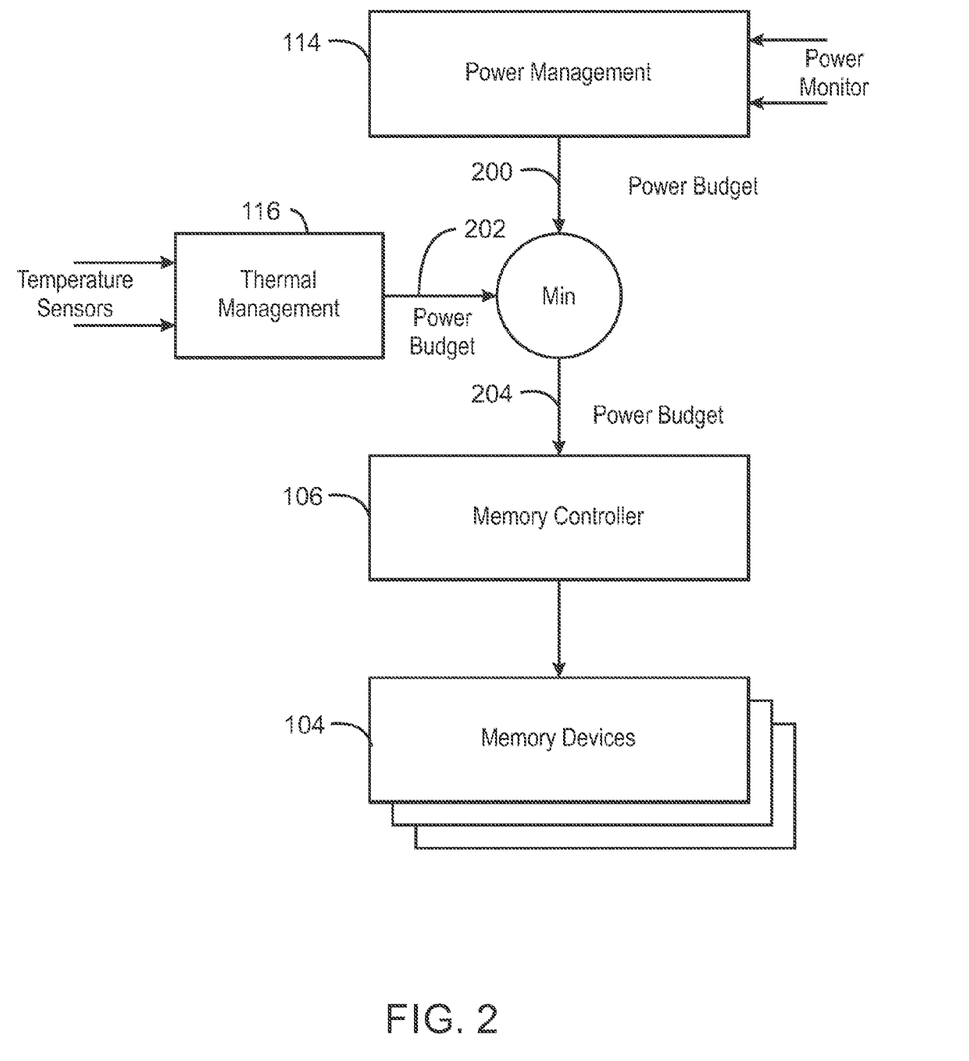
FIG. 2 is an example of a computing device configured to perform power and thermal throttling.

To reduce the probability that thermal throttling will cause the memory bandwidth utilization to fall below the performance guarantee, the thermal throttling technique disclosed herein uses the performance guarantee as a parameter for computing the throttling parameter. In some examples, the thermal management throttling and the power management throttling are integrated as illustrated by FIG. 2. However, it will be appreciated that this is only one possible implementation. The techniques disclosed herein also apply to systems that separate the power management from the thermal management, as well as systems that do not use power management throttling.

FIG. 2 is an example of a computing device configured to perform power and thermal throttling. The computing device 100 includes the power management unit 114, thermal management unit 116, and memory controller 106 shown in FIG. 1. The power management unit 114, thermal management unit 116, and memory controller 106 can be implemented in any suitable form of computer logic, including hardware or a combination of hardware and software. Some embodiments may be implemented as instructions stored on the tangible, non-transitory, computer-readable medium, which may be read and executed by a processor to perform the operations described. In addition, a computer-readable medium may include any mechanism for storing or transmitting information in a form readable by a computer. For example, a computer-readable medium may include Read-Only Memory (ROM), Random Access Memory (RAM), magnetic disk storage media, optical storage media, flash memory devices, or electrical, optical, acoustical or other form of propagated signals, e.g., carrier waves, infrared signals, digital signals, or the interfaces that transmit and/or receive signals, among others. The power management unit 114, thermal management unit 116, and memory controller 106 can also be implemented as a logic unit, such as an Application Specific Integrated Circuit (ASIC), a Field Programmable Gate Array (FPGA), or an arrangement of logic gates implemented in one or more integrated circuits, for example. Additionally, the power management unit 114, thermal management unit 116, and memory controller 106 can be implemented as separate logic units or combined into a single logic unit. They can also be implemented in software running on a hardware control processor.

In the example shown in FIG. 2, the power management unit 114 monitoring existing power consumption calculates a power budget 200 which can cause power throttling if some user-given power limit is violated. The thermal management unit 116 receives one or more measured junction temperatures. Based on the measured junction temperatures, the thermal management unit 116 computes a thermal throttling power budget 202. In this example, the power budget 200 based on the power management unit and the power budget 202 based on the thermal management unit are combined into a new power budget 204 in such a way that both thermal limit and power limit are satisfied.

The combined power budget 204 is supplied to the memory controller 106. Alternatively, a bandwidth-based throttling parameter could be calculated and supplied by the thermal and power management units to the memory controller, instead of the power budget 204. The memory controller limits the number of memory operations that it performs if throttling is required. In the example of FIG. 2, in which the throttling parameter is expressed as a power budget 204, the memory controller 106 limits the number of memory operations performed to keep the total power consumed by the memory operations below the power budget.

Two examples of algorithms that can be used to compute the throttling parameter as a thermal power budget are described below. The algorithms described below may use one or more of the following variables.

$T_{j,max}$ is the junction temperature limit for each component including memory. The junction temperature limit is the first temperature threshold above which proper functioning of the component cannot be guaranteed. In some examples, the junction temperature limit, $T_{j,max}$, may be approximately 95° C.

$BW_{PERF}$ is the bandwidth utilization constraint specified for the memory. In some examples, $BW_{PERF}$ can be determined to be the memory bandwidth used by the most memory-intensive workload. For example, $BW_{PERF}$ may be approximately 50 percent to 75 percent.

$BW_{THERM}$ is the memory bandwidth with which the memory temperature can be maintained below the maximum junction temperature, $T_{j,max}$, in response to the fastest ramp in memory workload. For example, $BW_{THERM}$ may be approximately 25 to 50 percent.

$\Delta T_{PERF}$ is the temperature difference used to specify the third temperature threshold $(T_{j,max}-\Delta T_{PERF})$ and corresponds with the bandwidth utilization constraint, $BW_{PERF}$. The memory bandwidth is throttled based on $BW_{PERF}$ when the measured junction temperature reaches within $\Delta T_{PERF}$ degrees of the $T_{j,max}$ limit.

$\Delta T_{THERM}$ is the temperature difference used in defining the second temperature threshold $(T_{j,max}-\Delta T_{THERM})$ and corresponds with $BW_{THERM}$. The memory bandwidth is throttled to $BW_{THERM}$ when the measured junction temperature reaches within $\Delta T_{THERM}$ degrees of the $T_{j,max}$ limit.

The threshold values $\Delta T_{THERM}$ and $\Delta T_{PERF}$ can be determined experimentally. In some examples, the values of the temperature thresholds $(T_{j,max}-\Delta T_{THERM})$ and $(T_{j,max}-\Delta T_{PERF})$ will be relatively close to the maximum junction temperature $T_{j,max}$ so as to maximize workload performance. For example, $\Delta T_{THERM}$ may be approximately 98 percent of the maximum junction temperature ($\Delta T_{THERM}=0.98*T_{j,max}$) and $\Delta T_{PERF}$ may be approximately 95 percent of the maximum junction temperature ($\Delta T_{PERF}=0.95*T_{j,max}$). Other temperature thresholds are also possible.

In some examples, the threshold values $\Delta T_{THERM}$ and $\Delta T_{PERF}$ are determined based, at least in part, on the resolution of the temperature sensors used to measure the junction temperature. $\Delta T_{THERM}$ should be greater than or equal to the minimum sensor resolution, and $\Delta T_{PERF}$ should be greater than or equal to $\Delta T_{THERM}$ plus the minimum sensor resolution. As an example, if the temperature sensor can be read in 1° C. increments, the minimum acceptable value of $\Delta T_{THERM}$ is 1° C. and the minimum acceptable value of $\Delta T_{THERM}$ is 2° C.

$BW_{MAX}$ is the maximum memory bandwidth. The value $BW_{MAX}$ will generally be equal to 100%.

$BW_{MIN}$ is the minimum memory bandwidth that will still enable any workload to make forward progress. For example, a $BW_{MIN}$ of 10 percent may be sufficient to avoid starving the memory of bandwidth.

In some examples, the throttling parameter can be computed according to the following conditions for a three threshold thermal throttling algorithm:

| | |
|---|---|
| If $(T_M > T_{j,max})$ then | TT_Budget := Max_Power * $BW_{MIN}$ |
| else if $(T_M > T_{j,max} - \Delta T_{THERM})$ then | TT_Budget := Max_Power * $BW_{THERM}$ |
| else if $(T_M > T_{j,max} - \Delta T_{PERF})$ then | TT_Budget := Max_Power * $BW_{PERF}$ |
| else | TT_Budget := Max_Power * $BW_{MAX}$ |

A two threshold thermal throttling algorithm will ignore the third line regarding the condition $(T_M > T_{j,max} - \Delta T_{PERF})$.

In the above algorithm, $T_M$ is the highest measured junction temperature of the memory devices 104, TT_Budget is the thermal throttling parameter, which is computed as a thermal power budget in this example, and Max_Power is the maximum power which can be consumed by the memory devices. The algorithm for computing the thermal throttling power budget uses three temperature thresholds, $T_{j,max}$, $T_{j,max}-\Delta T_{THERM}$, and $T_{j,max}-\Delta T_{PERF}$. The thermal throttling power budget can be computed for each temperature sampling period, which may be a few watts to a hundred watt. In the above algorithm, the memory bandwidth utilization is allowed to 'burst' above $BW_{PERF}$ until the measured temperature, $T_M$, of any memory device 104 crosses above the temperature threshold $T_{j,max}-\Delta T_{PERF}$.

When $T_M$ exceeds the temperature threshold $T_{j,max}-\Delta T_{PERF}$, the memory bandwidth is limited to the $BW_{PERF}$. Limiting the memory bandwidth in this way helps ensure that the memory bandwidth does not momentarily fall below the utilization constraint. Only if the measured junction temperature, $T_M$, continues to rise and exceeds the next temperature threshold, $T_{j,max}-\Delta T_{THERM}$, then the memory bandwidth is limited to $BW_{THERM}$, which is a lower bandwidth than $BW_{PERF}$.

If the measured junction temperature, $T_M$, exceeds the maximum junction temperature, $T_{j,max}$, then the memory bandwidth is limited to $BW_{MIN}$, which is selected to be low enough to enable the memory devices 104 to cool without completely starving the memory of bandwidth. Results of the algorithm described above are shown in FIG. 4.

In some examples, the thermal throttling power budget is computed using a Proportional-Integral-Derivative (PID)

controller algorithm. The PID controller can be included in the thermal management unit and implemented as integrated circuit components or programming instructions. The PID controller is a control loop feedback algorithm that calculates an error value as the difference between a measured variable and a desired set point. In the present example, the measured variable is the highest measured junction temperature, $T_M$, and the desired set point is the temperature threshold, $T_{j,max}-\Delta T_{PERF}$, which is the temperature threshold that corresponds with the bandwidth utilization constraint, $BW_{PERF}$. Using the PID controller, the thermal throttling power budget, TT_Budget, can be computed according to the following equation.

$$TT\_Budget = K_d \frac{dT_M}{dt} + K_p(T_{target} - T_M) + K_i \int_t^{t+\tau} (T_{target} - T_M) dt$$

The PID controller can be tuned to obtain the PID coefficients $K_p$, $K_i$, and $K_d$. To tune the PID controller, first the PID coefficients are tuned to maximize workload performance while ensuring that, under real workloads and/or normal ambient temperature, the memory subsystem operates at or below $T_{target}=T_{j,max}-\Delta T_{PERF}$ and delivers memory performance at or above $BW_{PERF}$. Secondly, under a high bandwidth synthetic workload, such as a power virus, and/or worst-case thermal conditions, such as heating from other components, the PID controller may be adjusted to still operate below $T_{j,max}-\Delta T_{THERM}$ at a lowered memory bandwidth of $BW_{THERM}$. In an example in which the temperature target, $T_{target}$, was set at 93° C., the PID controller tuning may result in PID coefficients of $K_p=0.2$, $K_i=0.6$, $K_d=0$.

Once the thermal throttling power budget is computed, it can be used by memory controller 106 to limit the memory bandwidth so that the average power used by the memory devices 104 stays under the thermal throttling power budget. Each memory transaction consumes a certain amount of electrical power that is predictable and repeatable. In some examples, the memory controller 106 implements a technique wherein the controller counts the number of each type of memory transactions occurring within a specified time period and computes a corresponding power consumption based on the number of different types of memory transactions and their corresponding energy weights. The memory controller 106 temporarily stops issuing memory transactions once the thermal throttling power budget is reached. At the end of the time period, memory transactions can start being issued again, and the process repeats for the successive time period.

Figure 3:
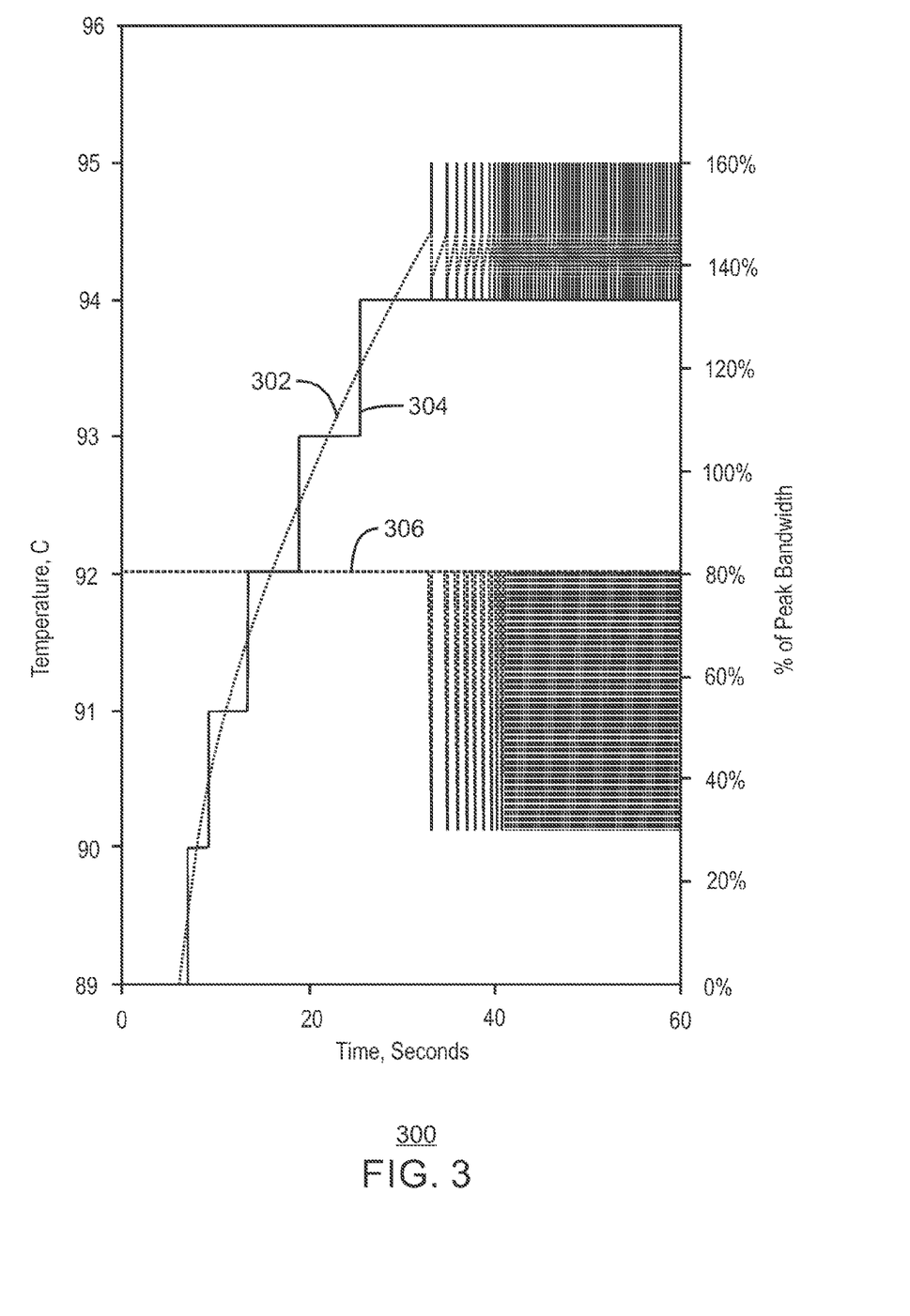
FIG. 3 is a graph that shows simulated results for an example two-threshold thermal throttling algorithm.

FIG. 3 is a graph that shows simulated results for an example two-threshold thermal throttling algorithm. The graph 300 shows the junction temperature of a memory device superimposed over memory bandwidth percentage. In FIG. 3, the actual junction temperature is shown with the dotted line 302, the measured junction temperature is shown with the solid line 304, and the bandwidth throttling parameter is shown with the dashed line 306. The difference between the actual temperature and the measured temperature is a result of the resolution of the temperature sensor, which is one degree Celsius in this example.

The two temperature thresholds are 94 degrees Celsius and 95 degrees Celsius. Note when the actual temperature is above 94.5 degrees Celsius, due to the one degree sensor resolution the sampled temperature is measured at 95 degrees or above. As this measured temperature is strictly greater higher than the temperature threshold of 95 degrees, throttling is imposed to a 30 percent bandwidth throttling factor. Although not shown in FIG. 3, if the measured temperature is above the 95 degree threshold (i.e. the actual temperature greater than 95.5 degrees), a 10 percent bandwidth throttling factor is imposed. FIG. 3 shows the heating of a memory device as a function of time after startup ramp. At startup, the memory bandwidth is allowed to burst, meaning that no limit is placed on the memory bandwidth. FIG. 3 shows the memory bandwidth peaking at 80 percent during this time, which is an approximate memory bandwidth that might be expected in a real workload scenario. The high bandwidth, causes the memory device's junction temperature to increase. At approximately 25 seconds, the measured temperature of 95 degrees reaches above the 94 degree threshold, at which time the 30 percent bandwidth throttling factor is imposed. At the 30 percent bandwidth throttling factor, the memory device cools down quickly. When the measured temperature falls at or below the 94 degree threshold (corresponding to an actual temperature crossing 94.5 degree), the memory device is allowed to burst again. This cycle repeats over time, resulting in an average temperature of between 94 and 95 degrees and an average memory bandwidth percentage of approximately 67 percent. However, the instantaneous bandwidth percentage regularly falls to 60 percent, which still meets the performance constraint.

Figure 4:
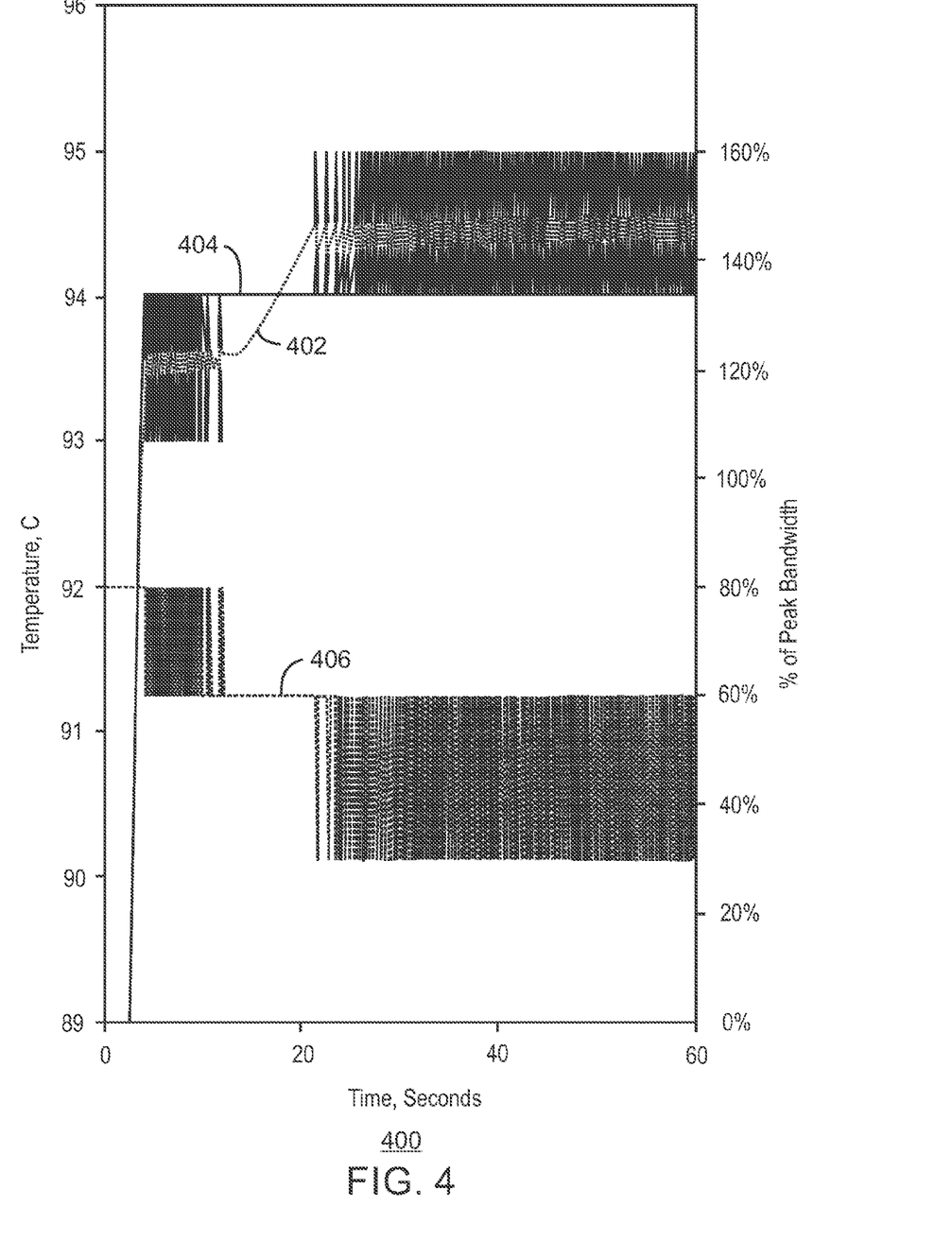
FIG. 4 is a graph that shows simulated results for an example three-threshold thermal throttling algorithm.

FIG. 4 is a graph that shows simulated results for an example three-threshold thermal throttling algorithm. The graph 400 shows the junction temperature of a memory device superimposed over memory bandwidth percentage. In FIG. 4, the actual junction temperature is shown with the dotted line 402, the measured junction temperature is shown with the solid line 404, and the throttling parameter is shown with the dashed line 406.

The three temperature thresholds are $T_{j,max}-\Delta T_{PERF}=93$ degrees Celsius, $T_{j,max}-\Delta T_{THERM}=94$ degrees Celsius, and $T_{j,max}=95$ degrees Celsius. If measured temperatures equal to 94 degrees Celsius (i.e. 93<measured temperature <=94), a 60 percent bandwidth throttling factor ($BW_{PERF}$) is imposed. With measured temperatures equal to 94 degrees, a 30 percent bandwidth throttling factor ($BW_{THERM}$) is imposed. With measured temperatures strictly greater than the 95 degree threshold, a 10 percent bandwidth throttling factor ($BW_{MIN}$) is imposed.

Similar to what is shown in FIG. 3, FIG. 4 shows that the memory bandwidth is allowed to burst to 80 percent at startup, which causes the memory device to heat rapidly. At approximately 5 seconds, the measured temperature passes the 94 degree threshold, at which time the 60 percent bandwidth throttling factor is imposed. At the 60 percent bandwidth throttling factor, the memory device cools quickly. When the measured temperature falls below the 94 degree threshold, the memory device is allowed to burst again. This cycle repeats over time, resulting in an average temperature between 93 and 94 degrees and an average memory bandwidth percentage of 64 percent. The average bandwidth of the memory device does not change considerably compared to the two-threshold example, and the instantaneous bandwidth percentage does not fall below 60 percent. Only if the temperature continues to rise, for example due to an elevated ambient temperature, the instantaneous bandwidth will be throttled to 30 percent.

FIGS. 3 and 4 assume ambient temperatures of 63.4 degrees Celsius and 70 degrees Celsius respectively. Actual results will vary depending on the ambient temperature, the thermal properties of the memory devices, and various other factors. Furthermore, the specific temperature thresholds and bandwidth percentages are merely provided as examples. Any suitable combination of temperature thresholds and thermal throttling factors may be used in consideration of the design parameters and desired performance characteristics of a particular implementation.

Figure 5:
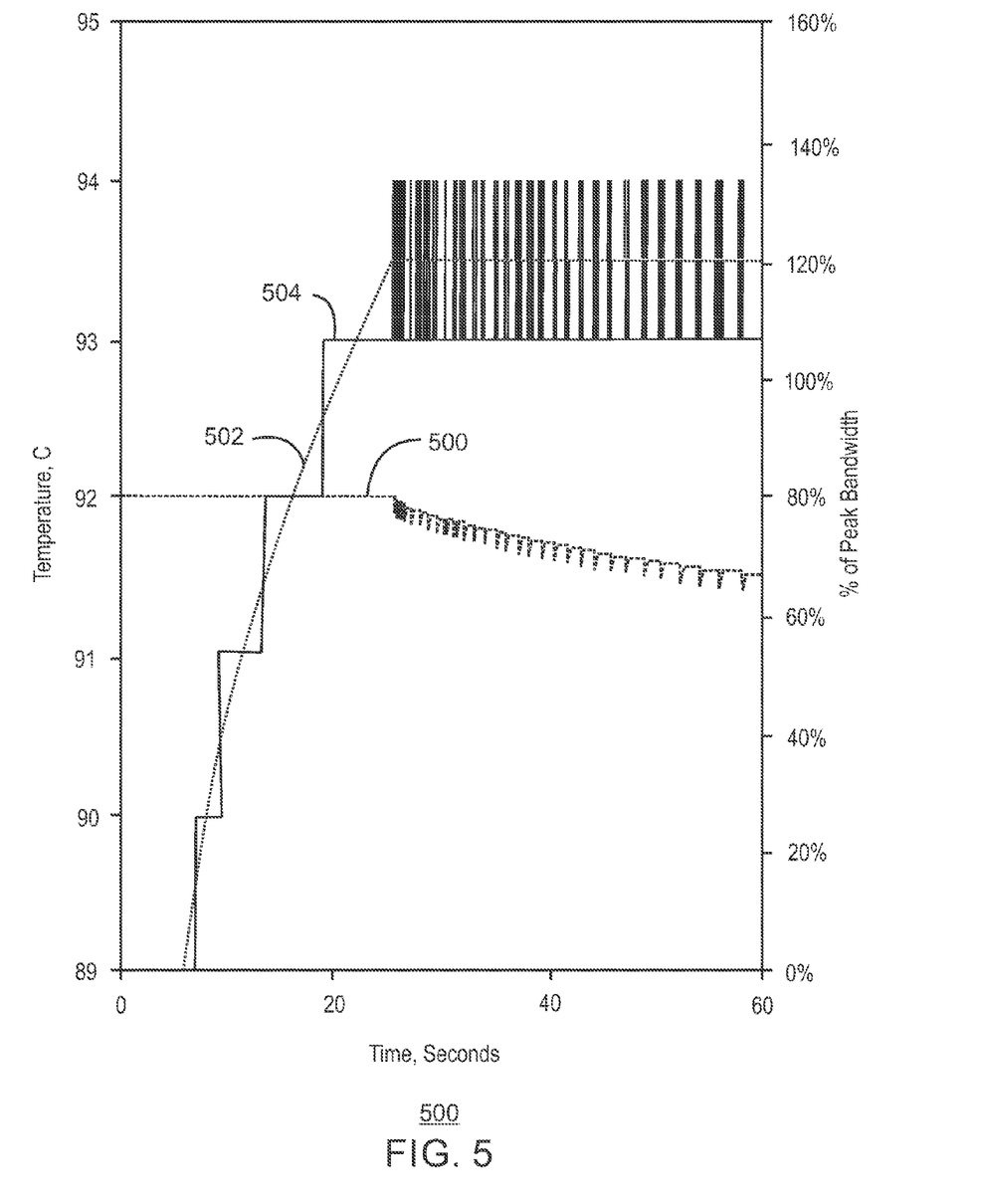
FIG. 5 is a graph that shows simulated results for an example thermal throttling algorithm based on a proportional-integral-derivative (PID) controller.

FIG. 5 is a graph that shows simulated results for an example thermal throttling algorithm based on a proportional-integral-derivative (PID) controller. The graph 500 shows the junction temperature of a memory device superimposed over memory bandwidth percentage. In FIG. 5, the actual junction temperature is shown with the dotted line 502, the measured junction temperature is shown with the solid line 504, and the throttling parameter is shown with the dashed line 506.

The example PID of FIG. 5 is tuned with a temperature target ($T_{target}$) set at 93 degrees Celsius, and is tuned to have coefficients of $K_p=0.2$, $K_i=0.6$, $K_d=0$. As shown in FIG. 5, the PID controller enables the memory subsystem to operate at or below $T_{target}=T_{j,max}-\Delta T_{PERF}$ and deliver memory performance at or above $BW_{PERF}$. The PID controller also provides smoother control responses of memory bandwidth with respect to power.

Figure 6:
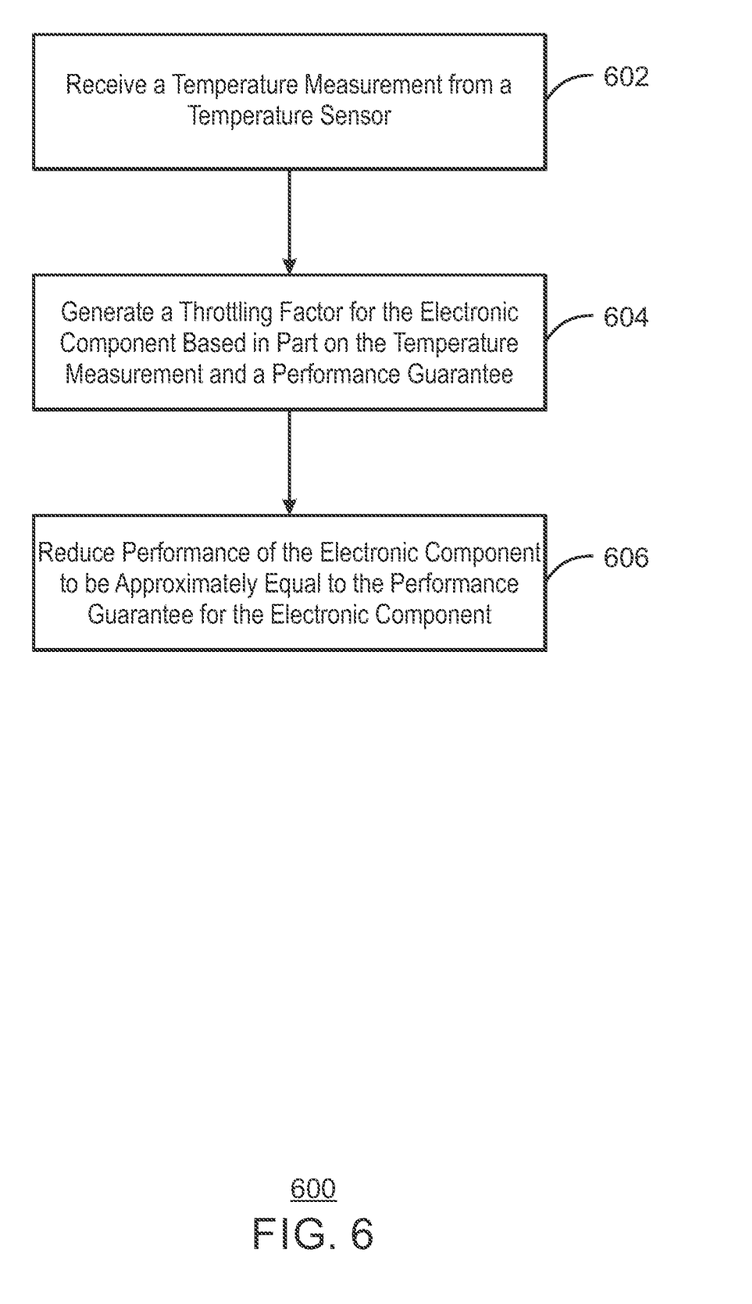
FIG. 6 is a process flow diagram of a thermal throttling method.

FIG. 6 is a process flow diagram of a thermal throttling method. The method 600 may be performed by the thermal management unit 116 and the memory controller 106. It will be understood that the method described herein can include fewer or additional actions. Furthermore, the method 600 should not be interpreted as implying that the actions have to be performed in any specific order.

At block 602, a temperature measurement is received from a temperature sensor. The temperature measurement corresponds with a junction temperature of an electronic component, such as a memory device or a processor. In some examples, two or more temperature measurements may be received from different temperature sensors and used to compute separate throttling factors for separate components. In other examples, two or more temperature measurements are combined by the thermal management unit 116 to supply the highest measured temperature to block 604.

At block 604, a throttling factor is generated for the electronic component based on the temperature measurement. The throttling factor may be computed in various ways. The technique used to generate the throttling factor takes into account a performance guarantee. For example, the throttling factor may be computed using an algorithm with three temperature thresholds, including a first temperature threshold that is a maximum junction temperature specified for the electronic component, a third temperature threshold that corresponds with the performance guarantee, a second temperature threshold between the first temperature threshold and the third temperature threshold. In some examples, the first temperature threshold, the second temperature threshold, and the third temperature threshold are separated in temperature by a measurement resolution of the temperature sensor.

If the temperature measurement is greater than the third temperature threshold but below or at the second threshold, the performance of the electronic component is reducing to be approximately equal to a performance guarantee for the electronic component. If the temperature measurement is greater than the second temperature threshold but below or at the first threshold, the performance of the electronic component is reduced to be less than a performance guarantee for the electronic component. If the temperature measurement is greater than the first temperature threshold, the performance of the electronic component is reduced to a minimum value. For example, in the case of a memory device, the performance is reduced to a minimum value that will avoid the likelihood of starvation, for example, 10 percent of the maximum memory bandwidth. In some examples, a power budget for the electronic component is received and the throttling factor is computed as a percentage of the power budget. In some examples, generating the throttling factor includes computing the throttling factor using a Proportional-Integral-Derivative control algorithm.

At block 606, the throttling factor is used to reduce performance of the electronic component. For example, if the electronic component is a Random Access Memory (RAM) such as a stacked Multiple Channel Dynamic Random Access Memory (MCDRAM), reducing the performance of the electronic component may include limiting a number of memory accesses to the RAM over a specified time period. Memory accesses may be throttled at a number of places: at the memory devices by the memory controller, or at the processor which generates the memory transactions. Reducing the performance of the electronic component may also include reducing a clock frequency of the electronic component. In some examples, the electronic component is a processor, such as a general purpose processor, a digital signal processor, a memory controller, a storage controller, a network interface controller, and others. The electronic component can be part of a multichip package. Depending on the measured temperature, the performance of the electronic component is reduced to be approximately equal to the performance guarantee for the electronic component.

The method may be repeated in a periodical fashion to maintain the electronic device at a suitable temperature below the maximum junction temperature specified for the electronic device. It is to be understood that the process flow diagram of FIG. 6 is not intended to indicate that the blocks of the method 600 are to be executed in any particular order, or that all of the blocks are to be included in every case. Further, any number of additional blocks may be included within the method 600, depending on the specific implementation.

EXAMPLES

Example 1 is a computing device to perform thermal throttling. The computing device includes an electronic component; a temperature sensor thermally coupled to the electronic component; and a thermal management controller to receive a temperature measurement from the temperature sensor and generate a throttling factor for the electronic component. If the temperature measurement is greater than a specified threshold, the throttling factor is to reduce performance of the electronic component to be at least a performance guarantee for the electronic component.

Example 2 includes the computing device of example 1, including or excluding optional features. In this example, the thermal management controller is to compute the throttling factor using an algorithm with three temperature thresholds. Optionally, the three temperature thresholds comprise: a first temperature threshold that is a maximum junction temperature specified for the electronic component; a third temperature threshold that is the specified threshold, which corresponds with the performance guarantee; and a second temperature threshold between the first temperature threshold and the third temperature threshold. Optionally, a difference between the first temperature threshold and the second temperature threshold is equal to a measurement resolution of the temperature sensor. Optionally, a difference between the second temperature threshold and the third temperature threshold is equal to a measurement resolution of the temperature sensor. If the temperature measurement is greater than the third temperature threshold but less than or equal to the second temperature threshold, the throttling factor is to reduce the performance of the electronic component to be at least the performance guarantee for the electronic component.

Example 3 includes the computing device of any one of examples 1 to 2, including or excluding optional features. In this example, the throttling factor is a percentage of the maximum power which can be consumed on the electronic component.

Example 4 includes the computing device of any one of examples 1 to 3, including or excluding optional features. In this example, the electronic component is a Random Access Memory (RAM) and the throttling factor is to cause a memory controller to limit a number of memory accesses to the RAM.

Example 5 includes the computing device of any one of examples 1 to 4, including or excluding optional features. In this example, the thermal management controller is to implement a Proportional-Integral-Derivative control algorithm.

Example 6 includes the computing device of any one of examples 1 to 5, including or excluding optional features. In this example, the electronic component is a Dynamic Random Access Memory (DRAM) located within a same package as a Central Processing Unit (CPU) of the computing device.

Example 7 includes the computing device of any one of examples 1 to 6, including or excluding optional features. In this example, the electronic component is a stacked Multiple Channel Dynamic Random Access Memory (MCDRAM).

Example 8 includes the computing device of any one of examples 1 to 7, including or excluding optional features. In this example, if throttling of the electronic component is activated, a Central Processing Unit (CPU) of the computing device will deny requests from an Operating System (OS) of the computing device to boost performance by activating a turbo mode.

Example 9 is a method of throttling an electronic component. The method includes receiving a temperature measurement from a temperature sensor, wherein the temperature measurement corresponds with a junction temperature of an electronic component; generating a throttling factor for the electronic component based on the temperature measurement; and in response to the throttling factor, reducing performance of the electronic component to be at least the performance guarantee for the electronic component if the temperature measurement is above a specified threshold.

Example 10 includes the method of example 9, including or excluding optional features. In this example, generating the throttling factor comprises computing the throttling factor using an algorithm with three temperature thresholds. Optionally, the three temperature thresholds comprise: a first temperature threshold that is a maximum junction temperature specified for the electronic component; a third temperature threshold that is the specified threshold, which corresponds with the performance guarantee; and a second temperature threshold between the first temperature threshold and the third temperature threshold. Optionally, a difference between the second temperature threshold and the third temperature threshold is equal to a measurement resolution of the temperature sensor. If the temperature measurement is greater than the third temperature threshold but less than or equal to the second temperature threshold, reducing performance of the electronic component to be at least the performance guarantee for the electronic component.

Example 11 includes the method of any one of examples 9 to 10, including or excluding optional features. In this example, the method includes receiving a power budget for the electronic component and computing the throttling factor as a percentage of the maximum power consumable by the component.

Example 12 includes the method of any one of examples 9 to 11, including or excluding optional features. In this example, the electronic component is a Random Access Memory (RAM) and reducing performance of the electronic component comprises limiting a number of memory accesses to the RAM over a specified time period.

Example 13 includes the method of any one of examples 9 to 12, including or excluding optional features. In this example, generating the throttling factor comprises computing the throttling factor using a Proportional-Integral-Derivative algorithm.

Example 14 includes the method of any one of examples 9 to 13, including or excluding optional features. In this example, the electronic component is a stacked Multiple Chip Dynamic Random Access Memory (MCDRAM).

Example 15 includes the method of any one of examples 9 to 14, including or excluding optional features. In this example, the electronic component is part of a multichip package.

Example 16 is a non-transitory computer-readable medium. The a non-transitory computer-readable medium includes instructions that direct the processor to receive a temperature measurement from a temperature sensor, wherein the temperature measurement corresponds with a junction temperature of an electronic component; and generate a throttling factor for the electronic component based on the temperature measurement. If the temperature measurement is greater than a specified threshold, the throttling factor is to reduce performance of the electronic component to be at least the performance guarantee for the electronic component.

Example 17 includes the non-transitory computer-readable medium of example 16, including or excluding optional features. In this example, the instructions to direct the processor to generate the throttling factor comprise instructions to compute the throttling factor using an algorithm with three temperature thresholds. Optionally, the three temperature thresholds comprise: a first temperature threshold that is a maximum junction temperature specified for the electronic component; a third temperature threshold that is the specified threshold, which corresponds with the performance guarantee; and a second temperature threshold between the first temperature threshold and the third temperature threshold. Optionally, a difference between the first temperature threshold and the second temperature threshold is equal to a measurement resolution of the temperature sensor. Optionally, a difference between the second temperature threshold and the third temperature threshold is equal to a measurement resolution of the temperature sensor. If the temperature measurement is greater than the third temperature threshold, the throttling factor is to reduce performance of the electronic component to be at least the performance guarantee for the electronic component.

Example 18 includes the non-transitory computer-readable medium of any one of examples 16 to 17, including or excluding optional features. In this example, the non-transitory computer-readable medium includes instructions to direct the processor to receive a power budget for the electronic component and compute the throttling factor as a percentage of the power budget.

Example 19 includes the non-transitory computer-readable medium of any one of examples 16 to 18, including or excluding optional features. In this example, the electronic component is a Random Access Memory (RAM) and the instructions direct a memory controller to limit a number of memory accesses to the RAM over a specified time period.

Example 20 includes the non-transitory computer-readable medium of any one of examples 16 to 19, including or excluding optional features. In this example, the instructions to direct the processor to generate the throttling factor comprise instructions to compute the throttling factor using a Proportional-Integral-Derivative algorithm.

Example 21 includes the non-transitory computer-readable medium of any one of examples 16 to 20, including or excluding optional features. In this example, the electronic component is a Dynamic Random Access Memory (DRAM) located within a same package as the processor.

Example 22 includes the non-transitory computer-readable medium of any one of examples 16 to 21, including or excluding optional features. In this example, the electronic component is a stacked Multiple Channel Dynamic Random Access Memory (MCDRAM).

Example 23 includes the non-transitory computer-readable medium of any one of examples 16 to 22, including or excluding optional features. In this example, the electronic component is part of a multichip package.

Example 24 is a computing device to perform thermal throttling. The computing device includes logic to receive a temperature measurement from a temperature sensor, wherein the temperature measurement corresponds with a junction temperature of an electronic component; logic to generate a throttling factor for the electronic component based on the temperature measurement; and logic to reduce performance of the electronic component based on the throttling factor. If the temperature measurement is greater than a specified threshold, the logic to reduce performance of the electronic component is to reduce performance of the electronic component to be at least the performance guarantee for the electronic component.

Example 25 includes the computing device of example 24, including or excluding optional features. In this example, the logic to generate the throttling factor comprises logic to compute the throttling factor using an algorithm with three temperature thresholds. Optionally, the three temperature thresholds include: a first temperature threshold that is a maximum junction temperature specified for the electronic component; a third temperature threshold that is the specified threshold, which corresponds with the performance guarantee; and a second temperature threshold between the first temperature threshold and the third temperature threshold. Optionally, a difference between the first temperature threshold and the second temperature threshold is equal to a measurement resolution of the temperature sensor. Optionally, a difference between the second temperature threshold and the third temperature threshold is equal to a measurement resolution of the temperature sensor. If the temperature measurement is greater than the third temperature threshold, the throttling factor is to reduce performance of the electronic component to be at least the performance guarantee for the electronic component.

Example 26 includes the computing device of any one of examples 24 to 25, including or excluding optional features. In this example, the computing device includes logic to receive a power budget for the electronic component and compute the throttling factor as a percentage of the power budget.

Example 27 includes the computing device of any one of examples 24 to 26, including or excluding optional features. In this example, the electronic component is a Random Access Memory (RAM) and the logic to reduce performance of the electronic component limits a number of memory accesses to the RAM over a specified time period.

Example 28 includes the computing device of any one of examples 24 to 27, including or excluding optional features. In this example, the logic to generate the throttling factor comprises logic to compute the throttling factor using a Proportional-Integral-Derivative algorithm.

Example 29 includes the computing device of any one of examples 24 to 28, including or excluding optional features. In this example, the electronic component is a Dynamic Random Access Memory (DRAM) located within the same package as a CPU of the computing device.

Example 30 includes the computing device of any one of examples 24 to 29, including or excluding optional features. In this example, the electronic component is a stacked Multiple Channel Dynamic Random Access Memory (MCDRAM).

Example 31 includes the computing device of any one of examples 24 to 30, including or excluding optional features. In this example, the computing device is a multichip package.

Example 32 is an apparatus to perform thermal throttling. The apparatus includes means for receiving a temperature measurement from a temperature sensor, wherein the temperature measurement corresponds with a junction temperature of an electronic component; means for generating a throttling factor for the electronic component based on the temperature measurement; and means for reducing performance of the electronic component based on the throttling factor. If the temperature measurement is greater than a specified threshold, the means for reducing performance of the electronic component are to reduce performance of the electronic component to be at least the performance guarantee for the electronic component.

Example 33 includes the apparatus of example 32, including or excluding optional features. In this example, the means for generating the throttling factor include means for computing the throttling factor using an algorithm with three temperature thresholds. Optionally, the three temperature thresholds comprise: a first temperature threshold that is a maximum junction temperature specified for the electronic component; a third temperature threshold that is the specified threshold, which corresponds with the performance guarantee; and a second temperature threshold between the first temperature threshold and the third temperature threshold. Optionally, a difference between the first temperature threshold and the second temperature threshold is equal to a measurement resolution of the temperature sensor. Optionally, a difference between the second temperature threshold and the third temperature threshold is equal to a measurement resolution of the temperature sensor. If the temperature measurement is greater than the third temperature threshold, the throttling factor is to reduce performance of the electronic component to be at least the performance guarantee for the electronic component.

Example 34 includes the apparatus of any one of examples 32 to 33, including or excluding optional features. In this example, the apparatus includes means for receiving a power budget for the electronic component and computing the throttling factor as a percentage of the power budget.

Example 35 includes the apparatus of any one of examples 32 to 34, including or excluding optional features. In this example, the electronic component is a Random Access Memory (RAM) and the means for reducing performance of the electronic component limits a number of memory accesses to the RAM over a specified time period.

Example 36 includes the apparatus of any one of examples 32 to 35, including or excluding optional features. In this example, the means for generating the throttling factor comprises means for computing the throttling factor using a Proportional-Integral-Derivative algorithm.

Example 37 includes the apparatus of any one of examples 32 to 36, including or excluding optional features. In this example, the electronic component is a Dynamic Random Access Memory (DRAM).

Example 38 includes the apparatus of any one of examples 32 to 37, including or excluding optional features. In this example, the electronic component is a stacked Multiple Channel Dynamic Random Access Memory (MCDRAM).

Example 39 includes the apparatus of any one of examples 32 to 38, including or excluding optional features. In this example, the apparatus comprises a mu In the above description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine, e.g., a computer. For example, a computer-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, described herein. The various appearances "an embodiment," "one embodiment," or "some embodiments" are not necessarily all referring to the same embodiments.

Not all components, features, structures, or characteristics described and illustrated herein are to be included in a particular embodiment or embodiments in every case. If the specification states a component, feature, structure, or characteristic "may", "might", "can" or "could" be included, for example, that particular component, feature, structure, or characteristic may not be included in every case. If the specification or claims refer to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein may not be arranged in the particular way illustrated and described herein. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the inventions are not limited to those diagrams or to corresponding descriptions herein. For example, flow need not move through each illustrated box or state or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. A computing device, comprising:
   an electronic component;
   a temperature sensor thermally coupled to the electronic component; and
   a thermal management controller to receive a temperature measurement from the temperature sensor and generate a throttling factor for the electronic component;
   wherein if the temperature measurement is greater than a specified threshold, the throttling factor is to reduce performance of the electronic component to be at least a performance guarantee for the electronic component;
   wherein the thermal management controller is to compute the throttling factor using an algorithm with three temperature thresholds comprising:
   a first temperature threshold that is a maximum junction temperature specified for the electronic component;
   a third temperature threshold that is the specified threshold, which corresponds with the performance guarantee; and
   a second temperature threshold between the first temperature threshold and the third temperature threshold, wherein a difference between the first temperature threshold and the second temperature threshold is equal to a measurement resolution of the temperature sensor.

2. The computing device of claim 1, wherein a difference between the second temperature threshold and the third temperature threshold is equal to a measurement resolution of the temperature sensor.

3. The computing device of claim 1, wherein if the temperature measurement is greater than the third temperature threshold but less than or equal to the second temperature threshold, the throttling factor is to reduce the performance of the electronic component to be at least the performance guarantee for the electronic component.

4. The computing device of claim 1, wherein the throttling factor is a percentage of the maximum power which can be consumed on the electronic component.

5. The computing device of claim 1, wherein the electronic component is a Random Access Memory (RAM) and the throttling factor is to cause a memory controller to limit a number of memory accesses to the RAM.

6. The computing device of claim 1, wherein the algorithm is a Proportional-Integral-Derivative control algorithm.

7. The computing device of claim 1, wherein the electronic component is a Dynamic Random Access Memory (DRAM) located within a same package as a Central Processing Unit (CPU) of the computing device.

8. The computing device of claim 1, wherein the electronic component is a stacked Multiple Channel Dynamic Random Access Memory (MCDRAM).

9. The computing device of claim 1, wherein if throttling of the electronic component is activated, a Central Processing Unit (CPU) of the computing device will deny requests from an Operating System (OS) of the computing device to boost performance by activating a turbo mode.

10. A method, comprising:
receiving a temperature measurement from a temperature sensor, wherein the temperature measurement corresponds with a junction temperature of an electronic component;
generating a throttling factor for the electronic component based on the temperature measurement; and
in response to the throttling factor, reducing performance of the electronic component to be at least the performance guarantee for the electronic component if the temperature measurement is above a specified threshold;
wherein generating the throttling factor comprises computing the throttling factor using an algorithm with three temperature thresholds comprising:
a first temperature threshold that is a maximum junction temperature specified for the electronic component;
a third temperature threshold that is the specified threshold, which corresponds with the performance guarantee; and
a second temperature threshold between the first temperature threshold and the third temperature threshold;
wherein a difference between the second temperature threshold and the third temperature threshold is equal to a measurement resolution of the temperature sensor.

11. The method of claim 10, comprising, if the temperature measurement is greater than the third temperature threshold but less than or equal to the second temperature threshold, reducing performance of the electronic component to be at least the performance guarantee for the electronic component.

12. The method of claim 10, comprising receiving a power budget for the electronic component and computing the throttling factor as a percentage of the maximum power consumable by the component.

13. The method of claim 10, wherein the electronic component is a Random Access Memory (RAM) and reducing performance of the electronic component comprises limiting a number of memory accesses to the RAM over a specified time period.

14. The method of claim 10, wherein generating the throttling factor comprises computing the throttling factor using a Proportional-Integral-Derivative algorithm.

15. A non-transitory computer-readable medium comprising instructions to direct a processor to:
receive a temperature measurement from a temperature sensor, wherein the temperature measurement corresponds with a junction temperature of an electronic component; and
generate a throttling factor for the electronic component based on the temperature measurement;
wherein, if the temperature measurement is greater than a specified threshold, the throttling factor is to reduce performance of the electronic component to be at least the performance guarantee for the electronic component;
wherein to generate the throttling factor comprises to compute the throttling factor using an algorithm with three temperature thresholds comprising:
a first temperature threshold that is a maximum junction temperature specified for the electronic component;
a third temperature threshold that is the specified threshold, which corresponds with the performance guarantee; and
a second temperature threshold between the first temperature threshold and the third temperature threshold;
wherein a difference between the first temperature threshold and the second temperature threshold is equal to a measurement resolution of the temperature sensor.

16. The computer-readable medium of claim 15, wherein a difference between the second temperature threshold and the third temperature threshold is equal to a measurement resolution of the temperature sensor.

* * * * *